(12) United States Patent
Lee et al.

(10) Patent No.: US 12,112,784 B2
(45) Date of Patent: Oct. 8, 2024

(54) MAGNETORESISTIVE RANDOM ACCESS MEMORY DEVICE

(71) Applicant: SAMSUNG ELECTRONICS CO., LTD., Suwon-si (KR)

(72) Inventors: Sungchul Lee, Osan-si (KR); Kyungjin Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 189 days.

(21) Appl. No.: 17/751,898

(22) Filed: May 24, 2022

(65) Prior Publication Data

US 2023/0079682 A1 Mar. 16, 2023

(30) Foreign Application Priority Data

Sep. 16, 2021 (KR) .................. 10-2021-0123786

(51) Int. Cl.
| | | |
|---|---|---|
| *G11C 11/00* | (2006.01) | |
| *G11C 11/16* | (2006.01) | |
| *H10B 61/00* | (2023.01) | |
| *H10N 50/10* | (2023.01) | |
| *H10N 50/80* | (2023.01) | |
| *H10N 50/85* | (2023.01) | |

(52) U.S. Cl.
CPC ............ *G11C 11/161* (2013.01); *H10B 61/00* (2023.02); *H10N 50/10* (2023.02); *H10N 50/80* (2023.02); *H10N 50/85* (2023.02)

(58) Field of Classification Search
CPC .................................................. G11C 11/161
See application file for complete search history.

(56) References Cited

U.S. PATENT DOCUMENTS

| | | | |
|---|---|---|---|
| 9,691,458 B2 | 6/2017 | Ralph et al. | |
| 10,020,039 B2 | 7/2018 | Fukami et al. | |
| 10,593,388 B2 | 3/2020 | Shiokawa et al. | |
| 10,636,962 B2 * | 4/2020 | Park | H01F 10/3254 |
| 10,665,375 B2 | 5/2020 | Ota et al. | |
| 2020/0006626 A1 | 1/2020 | Smith et al. | |
| 2020/0136017 A1 | 4/2020 | Ashida et al. | |
| 2020/0350364 A1 * | 11/2020 | Wan | H10B 61/22 |
| 2021/0118952 A1 | 4/2021 | Tsai et al. | |
| 2021/0134339 A1 | 5/2021 | Song et al. | |
| 2021/0210127 A1 * | 7/2021 | Drouard | G11C 11/161 |

FOREIGN PATENT DOCUMENTS

KR     10-2021-0033191 A     3/2021

* cited by examiner

*Primary Examiner* — Pho M Luu
(74) *Attorney, Agent, or Firm* — Muir Patent Law, PLLC

(57) ABSTRACT

A magneto resistive random access memory (MRAM) device including a spin orbit torque structure including a stack of an oxide layer pattern, a ferromagnetic pattern, and a non-magnetic pattern; and a magnetic tunnel junction (MTJ) structure on the spin orbit torque structure, the MTJ structure including a stack of a free layer pattern, a tunnel barrier pattern, and a pinned layer pattern, wherein the spin orbit torque structure extends in a first direction parallel to an upper surface of the spin orbit torque structure, the ferromagnetic pattern includes a horizontal magnetic material, and the free layer pattern has a magnetization direction in a vertical direction perpendicular to the upper surface of the spin orbit torque structure, the magnetization direction being changeable in response to spin currents generated in the spin orbit torque structure.

20 Claims, 6 Drawing Sheets

US 12,112,784 B2

MAGNETORESISTIVE RANDOM ACCESS MEMORY DEVICE

CROSS-REFERENCE TO RELATED APPLICATION

This application claims priority under 35 USC § 119 to Korean Patent Application No. 10-2021-0123786, filed on Sep. 16, 2021, in the Korean Intellectual Property Office (KIPO), the contents of which are incorporated by reference herein in their entirety.

BACKGROUND

1. Field

Embodiments relate to a magnetoresistive random access memory (MRAM) device.

2. Description of the Related Art

Recently, in order to reduce power consumption, a spin orbit torque-magnetoresistive memory device (SOT-MRAM) device that write data using spin orbit torque has been considered.

SUMMARY

The embodiments may be realized by providing a magnetoresistive random access memory device including a spin orbit torque structure including a stack of an oxide layer pattern, a ferromagnetic pattern, and a non-magnetic pattern; and a magnetic tunnel junction (MTJ) structure on the spin orbit torque structure, the MTJ structure including a stack of a free layer pattern, a tunnel barrier pattern, and a pinned layer pattern, wherein the spin orbit torque structure extends in a first direction parallel to an upper surface of the spin orbit torque structure, the ferromagnetic pattern includes a horizontal magnetic material, and the free layer pattern has a magnetization direction in a vertical direction perpendicular to the upper surface of the spin orbit torque structure, the magnetization direction being changeable in response to spin currents generated in the spin orbit torque structure.

The embodiments may be realized by providing a magnetoresistive random access memory device including a spin orbit torque structure extending in a first direction, the spin orbit torque structure having a structure in which a metal oxide layer pattern, a ferromagnetic pattern including a horizontal magnetic material, and a non-magnetic pattern including a non-magnetic metal material are sequentially stacked; a free layer pattern directly contacting the spin orbit torque structure, the free layer pattern having a magnetization direction perpendicular to an upper surface of the spin orbit torque structure, and the magnetization direction being changeable in response to spin currents generated in the spin orbit torque structure; a tunnel barrier pattern on the free layer pattern; and a pinned layer pattern on the tunnel barrier pattern, the pinned layer pattern having a vertical magnetization direction that is fixed.

The embodiments may be realized by providing a magnetoresistive random access memory device including a metal oxide layer pattern; a ferromagnetic pattern directly contacting an upper surface of the metal oxide layer pattern, and the ferromagnetic pattern including a horizontal magnetic material; a non-magnetic pattern directly contacting an upper surface of the ferromagnetic pattern, the non-magnetic pattern including a non-magnetic metal material; a free layer pattern directly contacting a portion of an upper surface of the non-magnetic pattern, the free layer pattern having a magnetization direction perpendicular to the upper surface of the non-magnetic pattern, and the magnetization direction being changeable in response to spin currents generated in a stacked structure including the metal oxide layer pattern, the ferromagnetic pattern, and the non-magnetic pattern; a tunnel barrier pattern on the free layer pattern; and a pinned layer pattern on the tunnel barrier pattern, the pinned layer pattern having a magnetization direction in a vertical direction that is fixed; wherein the spin currents are generated as an in-plane current is applied to the stacked structure including the metal oxide layer pattern, the ferromagnetic pattern, and the non-magnetic pattern, and the spin currents include a spin current generated by a spin Hall effect, a first interface spin current generated at a first interface between the oxide layer pattern and the ferromagnetic pattern, and a second interface spin current generated at a second interface between the ferromagnetic pattern and the non-magnetic pattern.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
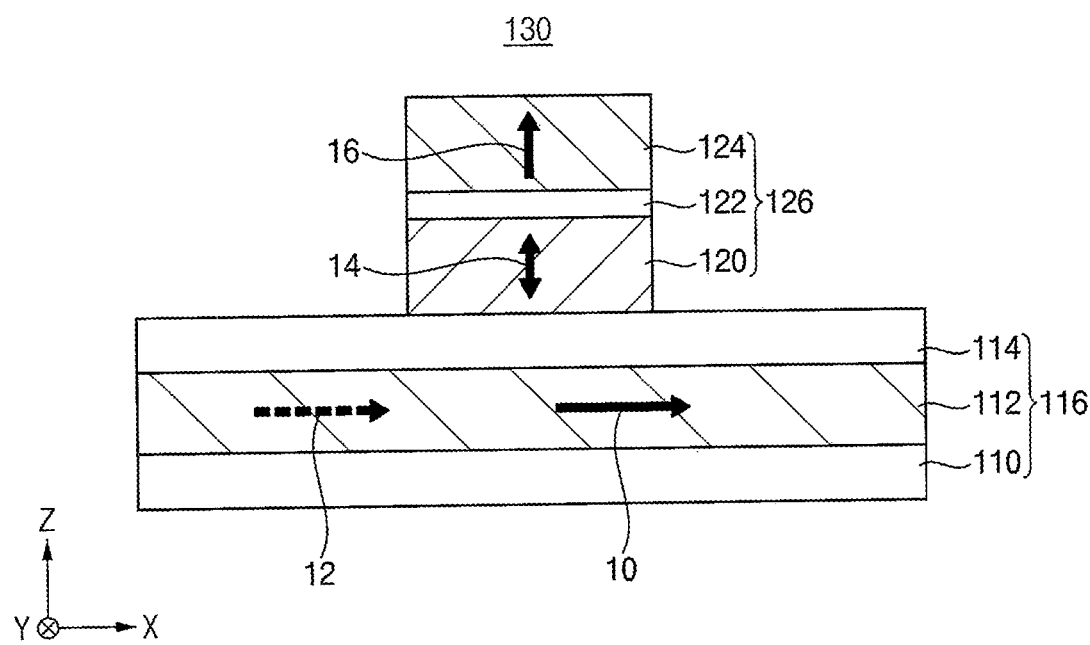
FIGS. 1 and 2 are a cross-sectional view and a perspective view, respectively, of a SOT-MRAM cell structure in accordance with example embodiments.
Figure 2:
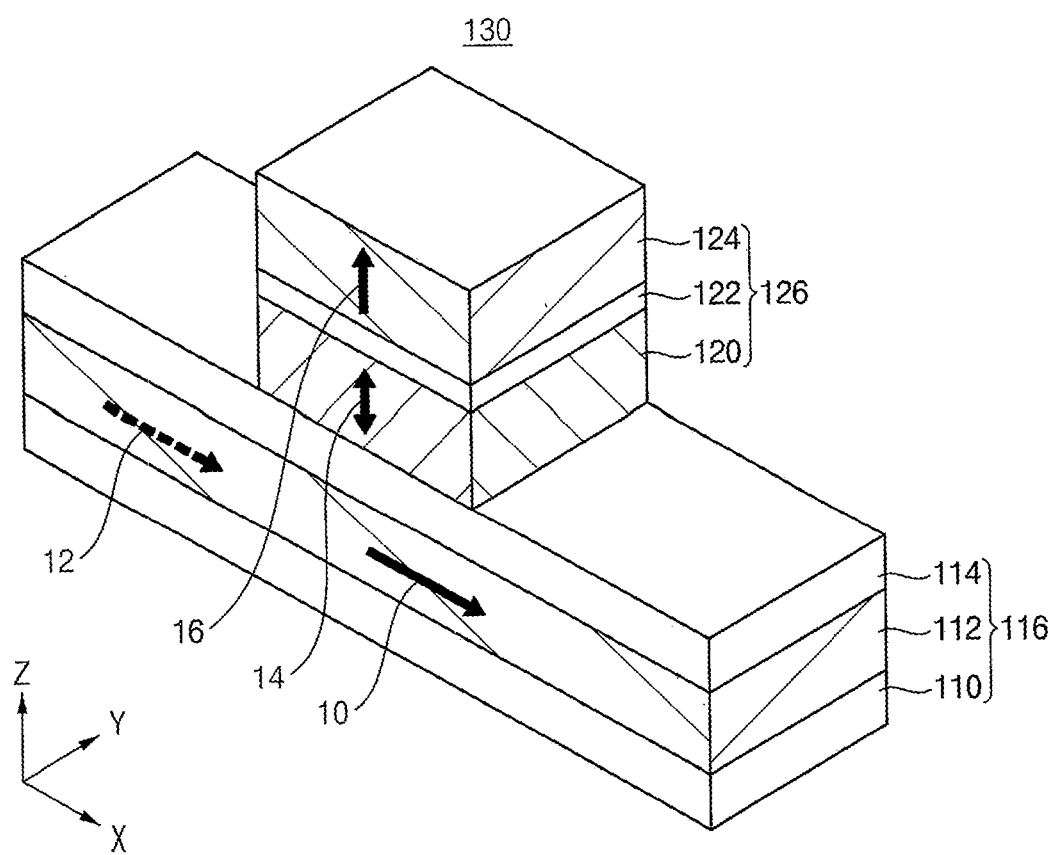

FIGS. 1 and 2 are a cross-sectional view and a perspective view, respectively, of a SOT-MRAM cell structure in accordance with example embodiments.

Referring to FIGS. 1 and 2, a memory cell structure 130 may include an oxide layer pattern 110, a ferromagnetic pattern 112, a non-magnetic pattern 114, and a magnetic tunnel junction (MTJ) structure 126.

The memory cell structure 130 may be on a lower structure. In an implementation, the lower structure may include a substrate. In an implementation, the lower structure may include a substrate and lower electrical elements on the substrate.

A stacked structure including the oxide layer pattern 110, the ferromagnetic pattern 112, and the non-magnetic pattern 114 may be a spin orbit torque structure 116 for generating a spin orbit torque (SOT). The spin orbit torque may be generated in the spin orbit torque structure 116, and the generated spin orbit torque may be applied to a free layer pattern 120 of the MTJ structure 126, so that a magnetization direction of the free layer pattern 120 may be changed. Upper and lower surfaces of the oxide layer pattern 110, the ferromagnetic pattern 112, and the non-magnetic pattern 114 may be substantially flat.

The spin orbit torque structure 116 may have a line shape extending in a first direction X. The first direction X may be a direction parallel to the upper surface of the spin orbit torque structure 116.

The oxide layer pattern 110 may include a metal oxide. In an implementation, the oxide layer pattern may include, e.g., cobalt oxide (CoOx), iron oxide (FeOx), nickel oxide (NiOx), magnesium oxide (MgOx), aluminum oxide (AlOx), tantalum oxide (TaOx), or zirconium oxide (ZrOx). As used herein, the term "or" is not an exclusive term, e.g., "A or B" would include A, B, or A and B. The oxide layer pattern 110 may include one metal oxide layer or two or more metal oxide layers stacked.

The ferromagnetic pattern 112 may directly contact the upper surface of the oxide layer pattern 110. In an implementation, a first interface may be between the oxide layer pattern 110 and the ferromagnetic pattern 112.

The ferromagnetic pattern 112 may include horizontal magnetic material. In an implementation, the ferromagnetic pattern 112 may include a horizontal magnetized ferromagnetic material having an in-plane magnetization direction. A magnetization direction 10 of the ferromagnetic pattern 112 may be the first direction X.

The ferromagnetic pattern 112 may be configured to generate vertical spin currents (Z-spin current) by a spin Hall effect. When an in-plane current 12 is applied to the spin orbit torque structure 116 in the first direction X, the vertical spin currents may be induced in the ferromagnetic pattern 112.

The oxide layer pattern 110 may be configured to induce interface spin currents in the vertical direction Z for field-free magnetization switching. In an implementation, when the in-plane currents 12 are applied to the spin orbit torque structure 116 in the first direction X, first interface spin currents in the vertical direction may be induced at the first interface between the oxide layer pattern 110 and the ferromagnetic pattern 112. The first interface spin currents may have a spin polarization of the vertical direction (Z) component. In an implementation, a spin component of the vertical direction (Z) may be transferred to the free layer pattern 120, so that the magnetization switching of the free layer pattern 120 may be induced.

An interface effect between the oxide layer pattern 110 and the ferromagnetic pattern 112 may be used in induction of the interface spin currents, and a thickness of the oxide layer pattern 110 may be a suitable thickness.

The ferromagnetic pattern 112 may include a ferromagnetic material, e.g., iron (Fe), cobalt (Co), nickel (Ni), chromium (Cr), platinum (Pt), or the like. The ferromagnetic pattern may further include, e.g., boron (B), silicon (Si), or zirconium (Zr). These may be used alone or in combination of two or more. In an implementation, the ferromagnetic pattern 112 may include a composite material, e.g., CoFe, NiFe, FeCr, CoFeNi, PtCr, CoCrPt, CoFeB, NiFeSiB, CoFeSiB, or the like.

A thickness of the ferromagnetic pattern 112 (e.g., in the Z-direction) may be less than a spin diffusion length of the ferromagnetic pattern 112. In an implementation, the thickness of the ferromagnetic pattern 112 may be 5 nm or less, e.g., about 1 nm to about 5 nm.

The non-magnetic pattern 114 may include a heavy metal. The non-magnetic pattern 114 may include, e.g., Ti, Cu, Pt, W, or Ta, or a composite material including two or more thereof.

The non-magnetic pattern 114 may directly contact an upper surface of the ferromagnetic pattern 112. In an implementation, a second interface may be between the ferromagnetic pattern 112 and the non-magnetic pattern 114.

The non-magnetic pattern 114 may be configured to induce the interface spin currents in the vertical direction (Z-direction) for field-free magnetization switching. In an implementation, when in-plane currents are applied to the spin orbit torque structure 116 in the first direction X, second interface spin currents in the vertical direction may be induced at the second interface between the non-magnetic pattern 114 and the ferromagnetic pattern 112. The second interface spin currents may have a spin polarization of the vertical direction component. In an implementation, a spin component of the vertical direction (Z) may be transferred to the free layer pattern 120, so that the magnetization switching of the free layer pattern 120 may be induced.

A thickness of the non-magnetic pattern 114 (e.g., in the Z-direction) may be less than a spin diffusion length of the non-magnetic pattern 114. In an implementation, the thickness of the non-magnetic pattern may be 5 nm or less, e.g., about 1 nm to about 5 nm. In an implementation, the non-magnetic pattern 114 may include Pt or Ta, and the thickness of the non-magnetic pattern may be about 2 nm to about 3 nm.

In the spin orbit torque structure 116, the ferromagnetic pattern 112 and the non-magnetic pattern 114 may be conductive wires through which in-plane currents flow.

The MTJ structure 126 may include the free layer pattern 120, a tunnel barrier pattern 122, and a pinned layer pattern 124 sequentially stacked. The MTJ structure 126 may have a pillar shape.

In an implementation, in the MTJ structure 126, a lower width and an upper width (e.g., in the X-direction) may be substantially the same. In an implementation, a sidewall of the MTJ structure 126 may be a vertical slope. In an implementation, in the MTJ structure 126, a lower width may be greater than an upper width. In an implementation, the width of the MTJ structure 126 may be gradually increased from a top of the MTJ structure 126 to a bottom of the MTJ structure 126. In an implementation, a sidewall of the MTJ structure 126 may have an inclined slope.

The free layer pattern 120 may include a vertical magnetized ferromagnetic material. A magnetization direction 14 of the free layer pattern 120 may be a vertical direction (e.g., Z-direction). In an implementation, the magnetization direction of the free layer pattern 120 may be variable. In an implementation, the magnetization direction of the free layer pattern 120 may be changeable by or in response to the spin orbit torque applied to the free layer pattern 120.

Spin-polarized currents may pass through the free layer pattern 120, so that the magnetization direction of the free layer pattern 120 may be changed and data may be written. In an implementation, the spin currents may be generated at the ferromagnetic pattern 112 in the spin orbit torque structure 116 by the spin Hall effect. The first interface spin currents may be induced at the first interface between the oxide layer pattern 110 and the ferromagnetic pattern 112, and the second interface spin currents may be induced at the second interface between the ferromagnetic pattern 112 and the non-magnetic pattern 114. The spin currents and the first and second interface spin currents may transfer spin components of the vertical direction to the free layer pattern 120, so that field-free magnetization switching may be performed. In an implementation, the magnetization switching may be performed without external magnetic fields.

In an implementation, the spin orbit torque structure 116 may have a stacked structure including the oxide layer pattern 110, the ferromagnetic pattern 112, and the non-magnetic pattern 114, and more interface spin currents may be induced. In an implementation, magnetization switching of the free layer pattern 120 may be induced in low threshold currents.

In an implementation, the free layer pattern 120 may include a ferromagnetic material, e.g., iron (Fe), cobalt (Co), nickel (Ni), chromium (Cr), platinum (Pt), or the like. The free layer pattern 120 may further include, e.g., boron (B), silicon (Si), or zirconium (Zr). These may be used alone or in combination of two or more. In an implementation, the free layer pattern 120 may include a composite material, e.g., CoFe, NiFe, FeCr, CoFeNi, PtCr, CoCrPt, CoFeB, NiFeSiB, and CoFeSiB.

The pinned layer pattern 124 may include a vertical magnetized ferromagnetic material. A magnetization direction 16 of the pinned layer pattern 124 may be the vertical direction. The magnetization direction 16 of the pinned layer pattern 124 may be fixed in one direction. The magnetization direction 16 of the pinned layer pattern 124 may not be changed by or in response to currents flowing through the MTJ structure 126.

In an implementation, the pinned layer pattern 124 may include a stack of a pinned pattern, a lower ferromagnetic pattern, an antiferromagnetic coupling spacer pattern, and an upper ferromagnetic pattern. In an implementation, the pinned pattern may include, e.g., manganese iron (FeMn), manganese iridium (IrMn), manganese platinum (PtMn), manganese oxide (MnO), manganese sulfide (MnS), tellurium manganese (MnTe), manganese fluoride ($MnF_2$), iron fluoride ($FeF_2$), iron chloride ($FeCl_2$), iron oxide (FeO), cobalt chloride ($CoCl_2$), cobalt oxide (CoO), nickel chloride ($NiCl_2$), nickel oxide (NiO), chromium (Cr), or the like. The upper and lower ferromagnetic patterns may each include, e.g., a ferromagnetic material including iron (Fe), nickel (Ni), or cobalt (Co). The antiferromagnetic coupling spacer pattern may include, e.g., ruthenium (Ru), iridium (Ir), or rhodium (Rh).

The tunnel barrier pattern 122 may be between the free layer pattern 120 and the pinned layer pattern 124. In an implementation, the free layer pattern 120 and the pinned layer pattern 124 may not directly contact each other.

In an implementation, the tunnel barrier pattern 122 may include an insulating metal oxide. In an implementation, the tunnel barrier pattern 122 may include, e.g., magnesium oxide (MgOx) or aluminum oxide (AlOx).

As described above, the upper surface of the oxide layer pattern 110 may contact a lower surface of the ferromagnetic pattern 112. A lower surface of the non-magnetic pattern 114 may contact the upper surface of the ferromagnetic pattern 112. The non-magnetic pattern 114 may contact a lower surface of the free layer pattern 120. The first and second interface spin currents may be generated at the first interface between the oxide layer pattern 110 and the ferromagnetic pattern 112 and at the second interface between the ferromagnetic pattern 112 and the non-magnetic pattern 114, respectively. Thus, the interface spin currents may increase. Accordingly, currents applied to the spin orbit torque structure 116 for magnetization switching of the free layer pattern 120 may be decreased. Further, operating currents of a SOT-MRAM device including a plurality of memory cell structures may be decreased.

Figure 3:
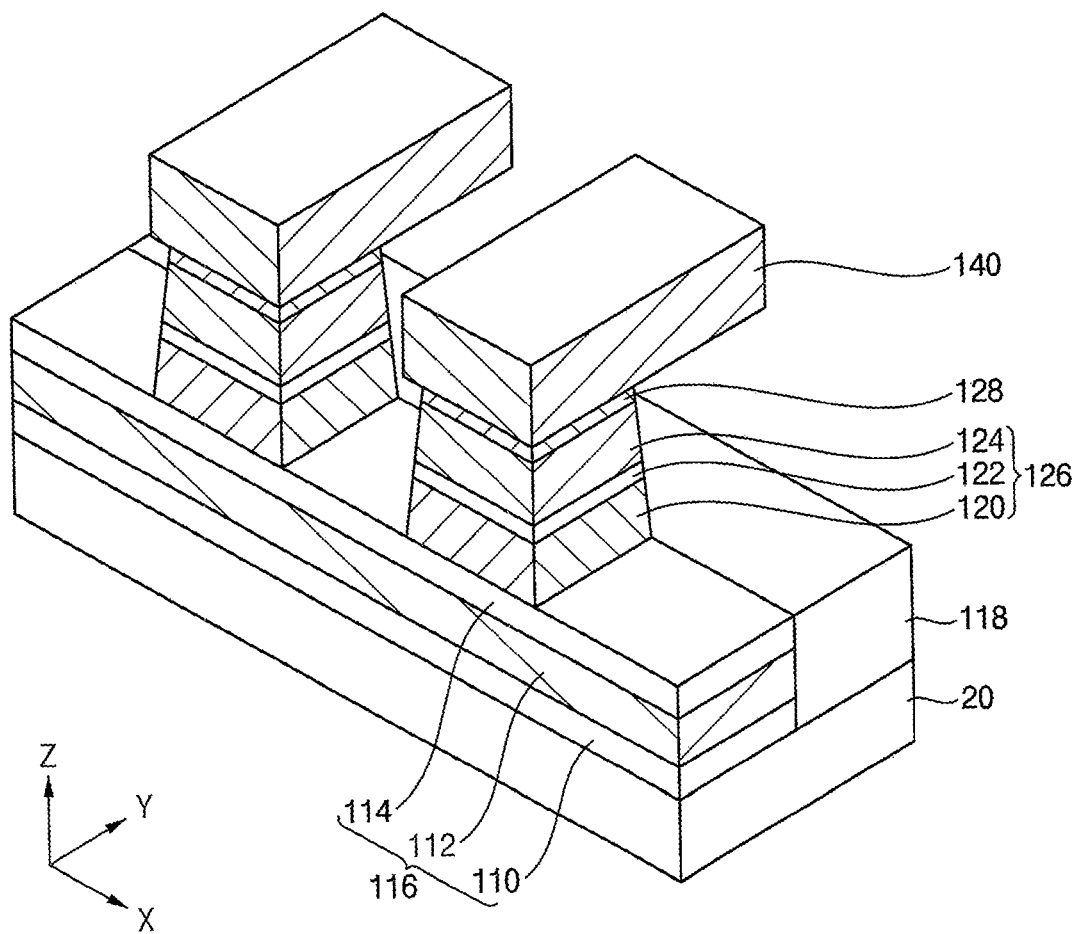
FIGS. 3 and 4 are a perspective view and a cross-sectional view, respectively, of a SOT-MRAM device in accordance with example embodiments.
Figure 4:
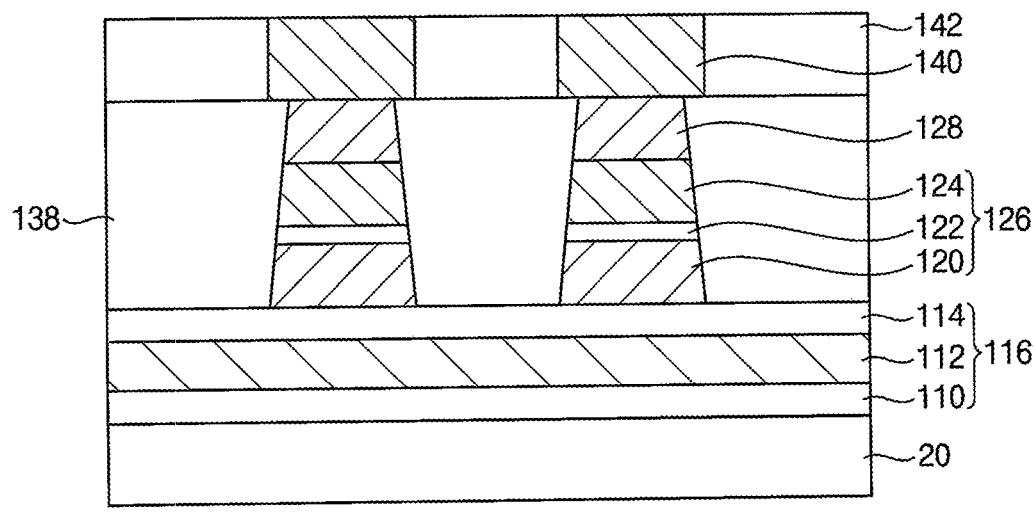

FIGS. 3 and 4 are a perspective view and a cross-sectional view, respectively, of a SOT-MRAM device in accordance with example embodiments.

The SOT-MRAM device may include SOT-MRAM cell structure substantially the same as that described with reference to FIG. 1. The SOT-MRAM device may have a cross-point array. In FIG. 3, first and second upper insulation patterns are omitted.

Referring to FIGS. 3 and 4, an oxide layer pattern 110, a ferromagnetic pattern 112, a non-magnetic pattern 114, MTJ structures 126, upper electrodes 128, and first conductive patterns 140 may be on a lower structure 20. In an implementation, a lower insulation pattern 118, a first upper insulation pattern 138, and a second upper insulation pattern 142 may be on the lower structure 20.

A stacked structure including the oxide layer pattern 110, the ferromagnetic pattern 112, and the non-magnetic pattern 114 may be a spin orbit torque structure 116 that generates a spin orbit torque.

The ferromagnetic pattern 112 may directly contact an upper surface of the oxide layer pattern 110, and the non-magnetic pattern 114 may directly contact an upper surface of the ferromagnetic pattern 112.

The spin orbit torque structure 116 may have a line shape extending (e.g., lengthwise) in a first direction X parallel to the upper surface of the spin orbit torque structure 116. In an implementation, a plurality of spin orbit torque structures 116 may be arranged in a second direction Y perpendicular to the first direction X. The spin orbit torque structures 116 may be parallel to each other.

The lower insulation pattern 118 may be in a space between the spin orbit torque structures 116. Upper surfaces of the spin orbit torque structure 116 and the lower insulation pattern 118 may be coplanar with each other.

The MTJ structures 126 may be on the spin orbit torque structures 116 and spaced apart from each other (e.g., in the first direction X). The free layer pattern 120 may contact an upper surface of the non-magnetic pattern 114.

The upper electrodes 128 may be on the MTJ structures 126, respectively.

The spin orbit torque structure 116 and the MTJ structure 126 may be substantially the same as the spin orbit torque structure and the MTJ structure described with reference to FIGS. 1 and 2, respectively.

The first upper insulation pattern 138 may fill a space between stacked structures including the MTJ structure 126 and the upper electrode 128. In an implementation, the first upper insulation pattern 138 may include, e.g., silicon oxide, silicon nitride, or silicon oxynitride. In an implementation, upper surfaces of the upper electrode 128 and the first upper insulation pattern 138 may be substantially coplanar with each other.

The first conductive pattern 140 may be on the upper electrode 128. In an implementation, the upper electrode 128 may be omitted. In this case, the first conductive pattern 140 may be on (e.g., directly on) the pinned layer pattern 124 of the MTJ structure 126. In an implementation, each of the first conductive patterns 140 may be electrically connected to the pinned layer patterns 124.

Each of the first conductive patterns 140 may have a line shape extending (e.g., lengthwise) in the second direction Y parallel to an upper surface of the of the spin orbit torque structure 116. The first conductive patterns 140 may be parallel to each other.

The second upper insulation pattern 142 may fill a space between the first conductive patterns 140. In an implementation, the second upper insulation pattern 142 may include, e.g., silicon oxide, silicon nitride, or silicon oxynitride. Upper surfaces of the first conductive patterns 140 and the second upper insulation pattern 142 may be substantially coplanar with each other.

MTJ structures 126 may be at a cross point of the spin orbit torque structure 116 and the first conductive pattern 140, respectively. In an implementation, the SOT-MRAM device may have a cross-point array.

In the SOT-MRAM device, the spin-polarized currents may flow to the free layer pattern through the spin orbit torque structure 116, so that data may be written in the MTJ structure. The spin-polarized currents may include spin hole currents, first interface currents between the oxide layer pattern 110 and the ferromagnetic pattern 112, and second interface currents between the ferromagnetic pattern 112 and the non-magnetic pattern 114. The spin hole currents, the first interface currents, and the second interface currents may be generated in the spin orbit torque structure 116. The data may be written in the free layer pattern of the MTJ structure 126 by the spin hole currents, and the first and second interface spin currents. The data may be written in only one selected MTJ structure 126 by controlling a voltage of the first conductive pattern 140.

Figure 5:
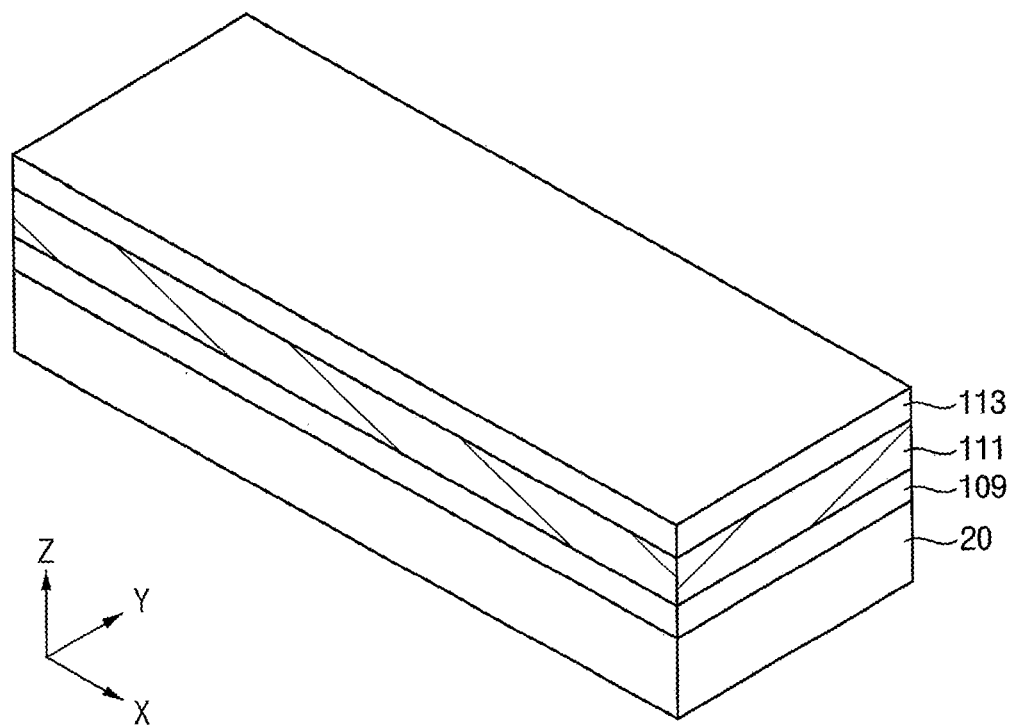
FIGS. 5 to 10 are perspective views and cross-sectional views of stages in a method of manufacturing a SOT-MRAM device in accordance with example embodiments.
Figure 6:
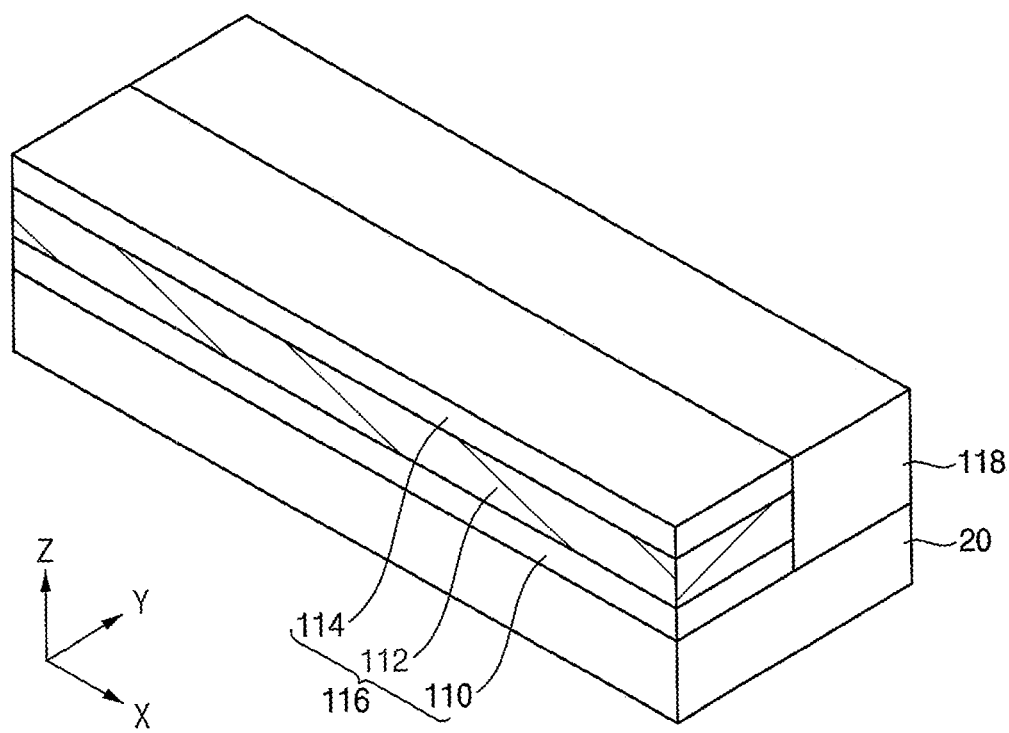

FIGS. 5 to 10 are perspective views and cross-sectional views of stages in a method of manufacturing a SOT-MRAM device in accordance with example embodiments. FIGS. 5 and 6 are perspective views, and FIGS. 7 to 10 are cross-sectional views.

Referring to FIG. 5, an oxide layer 109, a ferromagnetic layer 111, and a non-magnetic layer 113 may be sequentially formed on a lower structure 20.

In an implementation, the lower structure 20 may include a substrate. In an implementation, the lower structure 20 may include a substrate and lower electrical elements on the substrate.

Figure 7:
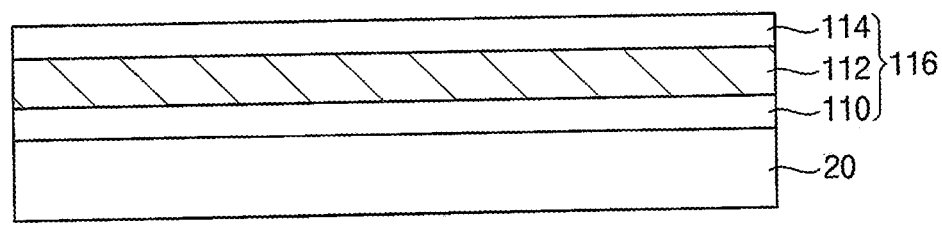

Referring to FIGS. 6 and 7, the oxide layer 109, the ferromagnetic layer 111, and the non-magnetic layer 113 may be patterned to form a spin orbit torque structure 116 including an oxide layer pattern 110, a ferromagnetic pattern 112 and a non-magnetic pattern 114 on the lower structure 20. The spin orbit torque structure 116 may have a line shape extending in the first direction X.

A lower insulation layer may be formed to cover the spin orbit torque structure 116. The lower insulation layer may be planarized until an upper surface of the lower insulation layer is exposed to form a lower insulation pattern 118. The planarization process may include a chemical mechanical polishing process or an etch-back process.

The lower insulation pattern 118 may include, e.g., silicon oxide, silicon nitride, or silicon oxynitride. As the planarization process is performed, upper surfaces of the spin orbit torque structure 116 and the lower insulation pattern 118 may be substantially coplanar with each other.

Figure 8:
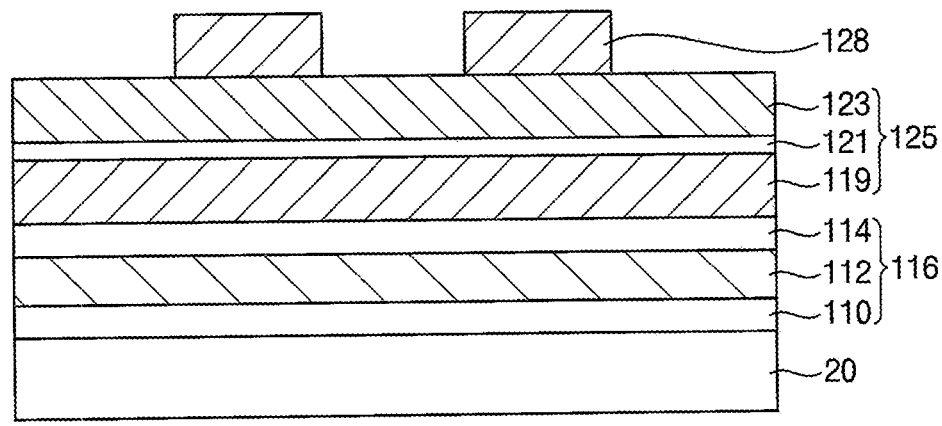

Referring to FIG. 8, an MTJ layer 125 may be formed on the spin orbit torque structure 116 and the lower insulation pattern 118. An upper electrode 128 may be formed on the MTJ layer 125.

The MTJ layer 125 may include a free layer 119, a tunnel barrier layer 121, and a pinned layer 123. In an implementation, the free layer 119, the tunnel barrier layer 121, and the pinned layer 123 may be sequentially stacked on the non-magnetic pattern 114 and the lower insulation pattern 118. The free layer 119 may contact upper surfaces of the non-magnetic pattern 114 and the lower insulation pattern 118.

An upper electrode layer may be formed on the pinned layer 123, and the upper electrode layer may be patterned to form an upper electrode 128. In an implementation, the upper electrode layer may include, e.g., tungsten, copper, platinum, nickel, silver, gold, or the like.

Figure 9:
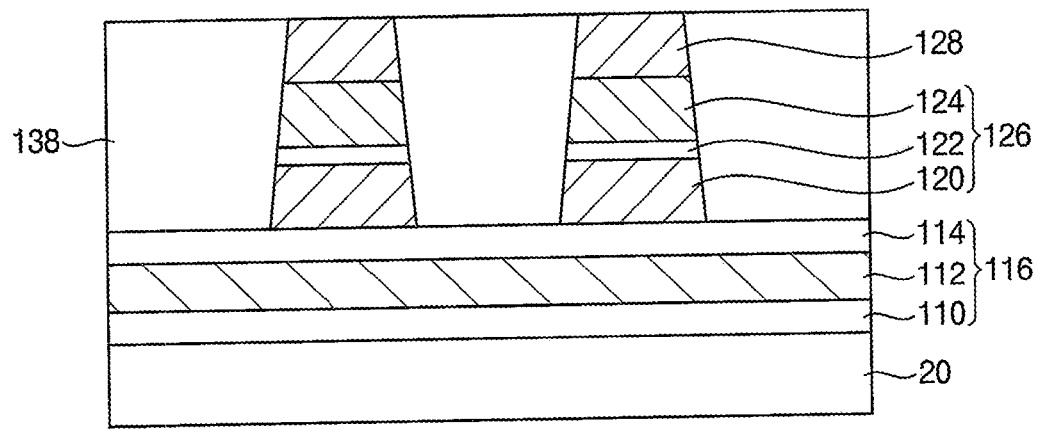

Referring to FIG. 9, the MTJ layer 125 may be anisotropically etched using the upper electrode 128 as an etch mask to form MTJ structures 126. The MTJ structures 126 may be formed on the non-magnetic pattern 114.

The etching process of the MTJ layer 125 may include a physical etching process, e.g., an ion beam etching (IBE) process. For example, the etching process may include an argon ion sputtering. In an implementation, the etching process may be performed while changing an incident angle of an ion beam used as an etching source.

The MTJ structure 126 may include a free layer pattern 120, a tunnel barrier pattern 122, and a pinned layer pattern 124 sequentially stacked. The MTJ structure 126 may have a pillar shape.

In an implementation, a lower width of the MTJ structure 126 may be greater than an upper width of the MTJ structure 126. In an implementation, the width of the MTJ structure 126 may be gradually increased from a top of the MTJ structure 126 to a bottom of the MTJ structure 126. A sidewall of the MTJ structure 126 may have an inclined slope. In an implementation, in the MTJ structure 126, a lower width and an upper width may be substantially same. In an implementation, the sidewall of the MTJ structure may be a vertical slope.

By performing the above process, a SOT-MRAM cell structure may be formed.

A first upper insulation layer may be formed on the spin orbit torque structure 116 and the lower insulation pattern 118 to fill a space between stacked structures including the MTJ structure 126 and the upper electrode 128. The first upper insulation layer may be planarized until an upper surface of the first upper insulation layer is exposed to form a first upper insulation pattern 138. The first upper insulation pattern 138 may be formed between the stacked structures including the MTJ structure 126 and the upper electrode 128.

Figure 10:
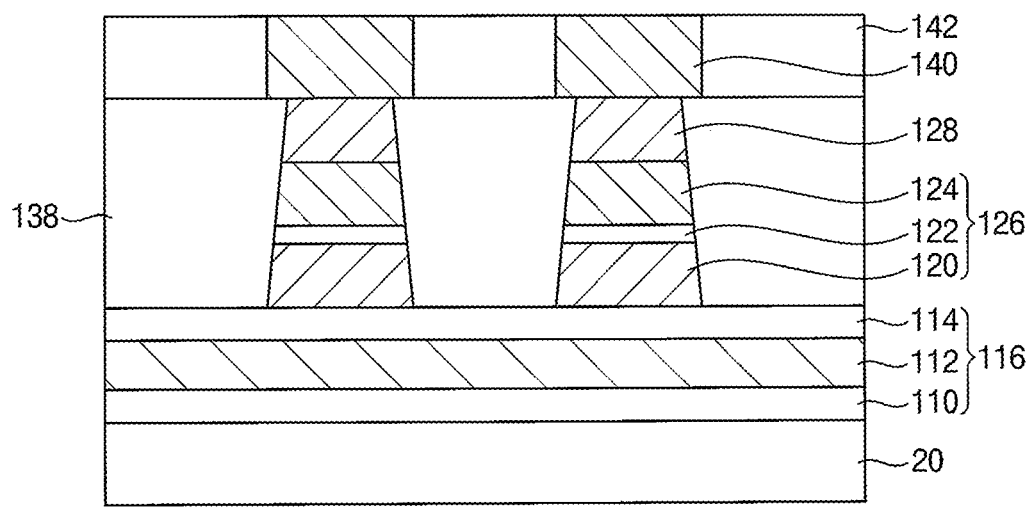

Referring to FIG. 10, first conductive patterns 140 may be formed on the first upper insulation pattern 138 and the upper electrode 128. Each of the first conductive patterns 140 may have a line shape extending in the second direction. A second upper insulation pattern 142 may be formed between the first conductive patterns 140.

In an implementation, the first conductive patterns 140 may be formed by a damascene process. In an implementation, a second upper insulation layer may be deposited on the first upper insulation pattern 138 and the upper electrode 128. The second upper insulation layer may be patterned to form second upper insulation patterns 142. Thereafter, a first conductive layer may be formed on the second upper insulation patterns 142 to fill a space between the second upper insulation patterns 142. The first conductive layer may be planarized until upper surfaces of the second upper insulation patterns 142 are exposed to form the first conductive patterns 140. The planarization process may include a chemical mechanical polishing process or an etch-back process.

In an implementation, the first conductive patterns 140 may be formed by an embossed patterning process. In an implementation, a first conductive layer may be formed on the first upper insulation pattern 138 and the upper electrode 128. The first conductive layer may be patterned to form the first conductive patterns 140. Further, a second upper insulation layer may be formed to cover the first conductive patterns 140. The second upper insulation layer may be planarized until the upper surfaces of the first conductive patterns 140 are exposed to form the second upper insulation patterns 142. The planarization process may include a chemical mechanical polishing process or an etch-back process.

By performing the above process, the SOT-MRAM device having a cross-point array may be manufactured.

Example 1

A free layer pattern was formed on a spin orbit torque structure in which an oxide layer pattern, a ferromagnetic pattern, and a non-magnetic pattern were stacked. The oxide layer pattern included cobalt oxide (CoO), the ferromagnetic pattern included cobalt (Co), and the non-magnetic pattern included titanium (Ti). The free layer pattern included cobalt (Co). A magnetization direction of the free layer pattern was aligned in the vertical direction Z. In-plane currents were applied to the spin orbit torque structure in the first direction X. Thereafter, a non-equilibrium spin concentration ($\delta s_z$) of a vertical spin component (Z-spin) induced in the free layer pattern was calculated.

Comparative Example 1

A free layer pattern was formed on a spin orbit torque structure in which the ferromagnetic pattern and the non-magnetic pattern were stacked. That is, the spin orbit torque structure did not include the oxide layer pattern. The ferromagnetic pattern included cobalt, and the non-magnetic pattern included titanium. The free layer pattern included cobalt. A magnetization direction of the free layer pattern was aligned in the vertical direction Z. In-plane currents were applied to the spin orbit torque structure in the first direction X. Thereafter, a non-equilibrium spin concentration ($\delta s_z$) of a vertical spin component (Z-spin) induced in the free layer pattern was calculated.

Figure 11:
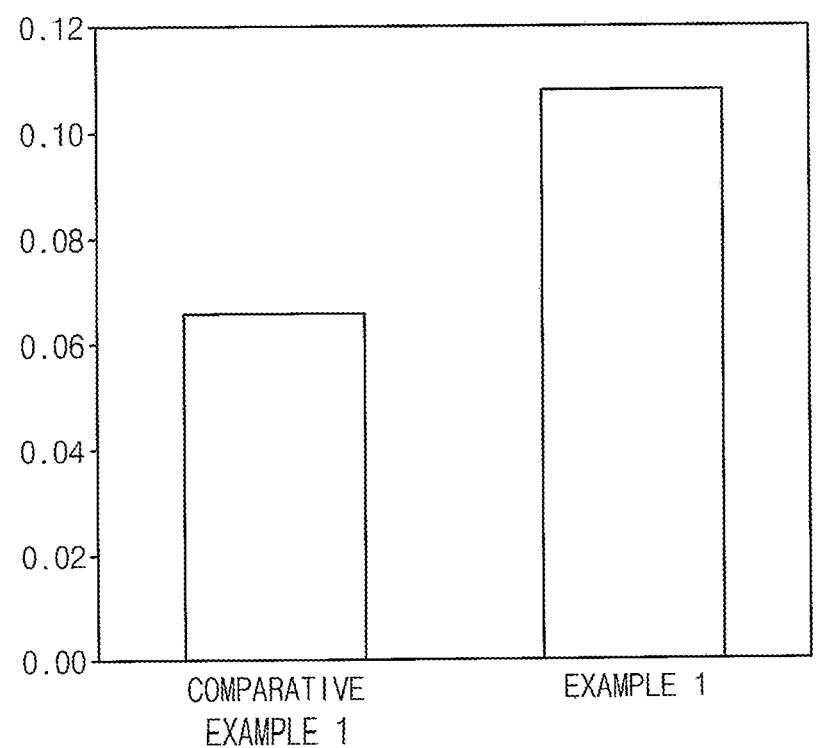
FIG. 11 is a graph of a non-equilibrium spin concentration ($\delta s_z$) of the vertical spin component (Z-spin) in each of Example 1 and Comparative Example 1.

FIG. 11 shows the non-equilibrium spin concentration ($\delta s_z$) of the vertical spin component (Z-spin) in each of Example 1 and Comparative Example 1.

Referring to FIG. 11, the non-equilibrium spin concentration of the vertical spin component (Z-spin) in the Example 1 was greater than the non-equilibrium spin concentration of the vertical spin component (Z-spin) in the Comparative Example 1. That is, when the oxide layer pattern was further included in the spin orbit torque structure, the non-equilibrium spin concentration of the vertical spin component (Z-spin) was increased, and thus interface spin currents in the vertical direction may be increased. Therefore, magnetization switching of the free layer pattern may be induced in low threshold currents.

The SOT-MRAM device according to an embodiment may be used as a memory included in electronic products such as mobile devices, memory cards, and computers.

By way of summation and review, a SOT-MRAM device may have excellent data writing characteristics.

One or more embodiments may provide a spin orbit torque-magnetoresistive memory device (SOT-MRAM) device.

One or more embodiments may provide a SOT-MRAM device having good characteristics.

In the MRAM device in accordance with example embodiments, interface spin currents may be generated at an interface between the oxide layer pattern and the ferromagnetic pattern and at the interface between the ferromagnetic pattern and the non-magnetic pattern, respectively, and thus the interface spin currents may increase. Accordingly, currents applied to the spin orbit torque structure for magnetization switching of the free layer pattern may decrease.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A magnetoresistive random access memory device, comprising:
    a spin orbit torque structure including a stack of an oxide layer pattern, a ferromagnetic pattern, and a non-magnetic pattern; and
    a magnetic tunnel junction (MTJ) structure on the spin orbit torque structure, the MTJ structure including a stack of a free layer pattern, a tunnel barrier pattern, and a pinned layer pattern,
    wherein:
    the spin orbit torque structure extends in a first direction parallel to an upper surface of the spin orbit torque structure,
    the ferromagnetic pattern includes a horizontal magnetic material, and
    the free layer pattern has a magnetization direction in a vertical direction perpendicular to the upper surface of the spin orbit torque structure, the magnetization direction being changeable in response to spin currents generated in the spin orbit torque structure.

2. The magnetoresistive random access memory device as claimed in claim 1, wherein the oxide layer pattern includes cobalt oxide (CoOx), iron oxide (FeOx), nickel oxide (NiOx), magnesium oxide (MgOx), aluminum oxide (AlOx), tantalum oxide (TaOx), or zirconium oxide (ZrOx).

3. The magnetoresistive random access memory device as claimed in claim 1, wherein the ferromagnetic pattern includes iron (Fe), cobalt (Co), nickel (Ni), chromium (Cr), platinum (Pt), boron (B), silicon (Si), zirconium (Zr), or a composite material thereof.

4. The magnetoresistive random access memory device as claimed in claim 1, wherein the non-magnetic pattern includes titanium (Ti), copper (Cu), platinum (Pt), tungsten (W), tantalum (Ta), or a composite material thereof.

5. The magnetoresistive random access memory device as claimed in claim 1, wherein:
    the ferromagnetic pattern directly contacts an upper surface of the oxide layer pattern, and
    the non-magnetic pattern directly contacts an upper surface of the ferromagnetic pattern.

6. The magnetoresistive random access memory device as claimed in claim 1, wherein the non-magnetic pattern directly contacts the free layer pattern of the MTJ structure.

7. The magnetoresistive random access memory device as claimed in claim 1, wherein:
    the pinned layer pattern has a vertical magnetization direction, and
    the magnetization direction of the pinned layer pattern is fixed in one direction.

8. The magnetoresistive random access memory device as claimed in claim 1, further comprising a first conductive pattern electrically connected to the pinned layer pattern on the MTJ structure, wherein the first conductive pattern has a line shape extending in a second direction parallel to an upper surface of the first conductive pattern and perpendicular to the first direction.

9. The magnetoresistive random access memory device as claimed in claim 1, wherein the free layer pattern includes iron (Fe), cobalt (Co), nickel (Ni), chromium (Cr), platinum (Pt), boron (B), silicon (Si), zirconium (Zr), or a composite material thereof.

10. The magnetoresistive random access memory device as claimed in claim 1, wherein:
the spin currents are generated as an in-plane current and are applied to the spin orbit torque structure in the first direction, and
the spin currents include a spin current generated by a spin Hall effect, a first interface spin current generated at a first interface between the oxide layer pattern and the ferromagnetic pattern, and a second interface spin current generated at a second interface between the ferromagnetic pattern and the non-magnetic pattern.

11. The magnetoresistive random access memory device as claimed in claim 1, wherein the ferromagnetic pattern has a thickness of 1 nm to 5 nm.

12. The magnetoresistive random access memory device as claimed in claim 1, wherein the non-magnetic pattern has a thickness of 1 nm to 5 nm.

13. A magnetoresistive random access memory device, comprising:
a spin orbit torque structure extending in a first direction, the spin orbit torque structure having a structure in which a metal oxide layer pattern, a ferromagnetic pattern including a horizontal magnetic material, and a non-magnetic pattern including a non-magnetic metal material are sequentially stacked;
a free layer pattern directly contacting the spin orbit torque structure, the free layer pattern having a magnetization direction perpendicular to an upper surface of the spin orbit torque structure, and the magnetization direction being changeable in response to spin currents generated in the spin orbit torque structure;
a tunnel barrier pattern on the free layer pattern; and
a pinned layer pattern on the tunnel barrier pattern, the pinned layer pattern having a vertical magnetization direction that is fixed.

14. The magnetoresistive random access memory device as claimed in claim 13, wherein the metal oxide layer pattern includes cobalt oxide (CoOx), iron oxide (FeOx), nickel oxide (NiOx), magnesium oxide (MgOx), aluminum oxide (AlOx), tantalum oxide (TaOx), or zirconium oxide (ZrOx).

15. The magnetoresistive random access memory device as claimed in claim 13, wherein the ferromagnetic pattern includes iron (Fe), cobalt (Co), nickel (Ni), chromium (Cr), platinum (Pt), boron (B), silicon (Si), zirconium (Zr), or a composite material thereof.

16. The magnetoresistive random access memory device as claimed in claim 13, wherein the non-magnetic pattern includes titanium (Ti), copper (Cu), platinum (Pt), tungsten (W), tantalum (Ta), or a composite material thereof.

17. The magnetoresistive random access memory device as claimed in claim 13, wherein a thickness of the ferromagnetic pattern is less than a spin diffusion length of the ferromagnetic pattern.

18. The magnetoresistive random access memory device as claimed in claim 13, wherein a thickness of the non-magnetic pattern is less than a spin diffusion length of the non-magnetic pattern.

19. The magnetoresistive random access memory device as claimed in claim 13, further comprising:
an upper electrode on the pinned layer pattern; and
a first conductive pattern on the upper electrode extending in a second direction parallel to the upper surface of the spin orbit torque structure and perpendicular to an extension direction of the spin orbit torque structure.

20. A magnetoresistive random access memory device, comprising:
a metal oxide layer pattern;
a ferromagnetic pattern directly contacting an upper surface of the metal oxide layer pattern, and the ferromagnetic pattern including a horizontal magnetic material;
a non-magnetic pattern directly contacting an upper surface of the ferromagnetic pattern, the non-magnetic pattern including a non-magnetic metal material;
a free layer pattern directly contacting a portion of an upper surface of the non-magnetic pattern, the free layer pattern having a magnetization direction perpendicular to the upper surface of the non-magnetic pattern, and the magnetization direction being changeable in response to spin currents generated in a stacked structure including the metal oxide layer pattern, the ferromagnetic pattern, and the non-magnetic pattern;
a tunnel barrier pattern on the free layer pattern; and
a pinned layer pattern on the tunnel barrier pattern, the pinned layer pattern having a magnetization direction in a vertical direction that is fixed;
wherein:
the spin currents are generated as an in-plane current is applied to the stacked structure including the metal oxide layer pattern, the ferromagnetic pattern, and the non-magnetic pattern, and
the spin currents include a spin current generated by a spin Hall effect, a first interface spin current generated at a first interface between the metal oxide layer pattern and the ferromagnetic pattern, and a second interface spin current generated at a second interface between the ferromagnetic pattern and the non-magnetic pattern.

* * * * *